(12) United States Patent
Nakae et al.

(10) Patent No.: US 12,267,068 B2
(45) Date of Patent: Apr. 1, 2025

(54) DETECTION METHOD, DETECTION DEVICE, AND DETECTION SYSTEM

(71) Applicant: Panasonic Intellectual Property Management Co., Ltd., Osaka (JP)

(72) Inventors: Ryo Nakae, Okayama (JP); Takehiko Nara, Okayama (JP); Naoki Tanaka, Okayama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/579,835

(22) PCT Filed: Jul. 21, 2022

(86) PCT No.: PCT/JP2022/028347
§ 371 (c)(1),
(2) Date: Jan. 16, 2024

(87) PCT Pub. No.: WO2023/013430
PCT Pub. Date: Feb. 9, 2023

(65) Prior Publication Data
US 2024/0322824 A1 Sep. 26, 2024

(30) Foreign Application Priority Data
Aug. 3, 2021 (JP) .................................. 2021-127758

(51) Int. Cl.
| | | |
|---|---|---|
| *H03K 17/96* | (2006.01) | |
| *H01H 13/00* | (2006.01) | |
| *H01H 13/52* | (2006.01) | |
| *H03K 17/975* | (2006.01) | |
| *H04N 23/51* | (2023.01) | |
| *G06F 3/041* | (2006.01) | |

(52) U.S. Cl.
CPC ........... *H03K 17/962* (2013.01); *H01H 13/00* (2013.01); *H01H 13/52* (2013.01); *H03K 17/975* (2013.01);
(Continued)

(58) Field of Classification Search
CPC ............... H03K 17/962; H03K 17/975; H03K 2217/96071; H04N 23/51; G06F 3/0414;
(Continued)

(56) References Cited

U.S. PATENT DOCUMENTS

| | | | | |
|---|---|---|---|---|
| 2011/0285662 A1* | 11/2011 | Maenpaa | ............... | G06F 3/0338 345/174 |
| 2013/0093715 A1* | 4/2013 | Marsden | ............... | G06F 3/0231 345/174 |

(Continued)

FOREIGN PATENT DOCUMENTS

| | | |
|---|---|---|
| JP | 2011-197750 A | 10/2011 |
| WO | 2019/230510 A1 | 12/2019 |
| WO | 2021/010037 A1 | 1/2021 |

OTHER PUBLICATIONS

International Search Report (ISR) issued on Oct. 11, 2022 in International (PCT) Application No. PCT/JP2022/028347 w/English Translation.

*Primary Examiner* — Tom V Sheng (57) ABSTRACT

A detection method includes: obtaining periodically and repeatedly sensor values output from a capacitive sensor; determining whether the sensor values obtained exceed threshold Th1; calculating, as first difference value $\Delta 1_X$ of each of target sensor values $C_X$, a difference between target sensor value $C_X$ and sensor value $C_{X+1}$ immediately before the target sensor value; calculating, as second difference value $\Delta 2_X$ of each of target sensor values $C_X$, a difference between (i) first difference value $\Delta 1_X$ of target sensor value $C_X$ and (ii) first difference value $\Delta 1_{X+1}$ of sensor value $C_{X+1}$ immediately before target sensor value $C_X$; comparing each of second difference values $\Delta 2_X$ calculated and threshold Th2, and selecting one sensor value $C_{Ret}$ based on a result of the comparing; and outputting the one sensor value $C_{Ret}$ selected.

6 Claims, 11 Drawing Sheets

(52) U.S. Cl.
CPC ........... *H04N 23/51* (2023.01); *G06F 3/0414* (2013.01); *G06F 2203/04105* (2013.01); *H03K 2217/96071* (2013.01)

(58) Field of Classification Search
CPC .......... G06F 2203/04105; H01H 13/00; H01H 13/52
USPC ........................................................ 345/174
See application file for complete search history.

(56) References Cited

U.S. PATENT DOCUMENTS

| | | | |
|---|---|---|---|
| 2013/0265273 A1* | 10/2013 | Marsden | G06F 3/0416 345/174 |
| 2013/0342502 A1* | 12/2013 | Wang | G06F 3/0446 345/174 |
| 2014/0028624 A1* | 1/2014 | Marsden | G06F 3/04883 345/174 |
| 2014/0347317 A1* | 11/2014 | Tanaka | G06F 3/04184 345/174 |
| 2015/0185909 A1* | 7/2015 | Gecnuk | G06F 3/0412 345/174 |
| 2015/0277626 A1* | 10/2015 | Shinkai | G06F 3/0447 345/174 |
| 2015/0378511 A1* | 12/2015 | Wu | G06F 3/044 324/672 |
| 2016/0179246 A1* | 6/2016 | Lee | G09G 5/003 345/174 |
| 2021/0165498 A1 | 6/2021 | Saito et al. | |
| 2022/0216868 A1 | 7/2022 | Yamabayashi et al. | |
| 2023/0259229 A1* | 8/2023 | Liu | G06F 3/044 345/174 |

* cited by examiner

DETECTION METHOD, DETECTION DEVICE, AND DETECTION SYSTEM

CROSS-REFERENCE TO RELATED APPLICATIONS

This application is the U.S. National Phase under 35 U.S.C. § 371 of International Application No. PCT/JP2022/028347, filed on Jul. 21, 2022, which claims the benefit of foreign priority to Japanese Patent Application No. 2021-127758 filed on Aug. 3, 2021, the entire contents of each of which are hereby incorporated by reference.

TECHNICAL FIELD

The present disclosure relates to a detection method, a detection device, and a detection system.

BACKGROUND ART

Patent Literature (PTL) 1 discloses an input device that outputs a video signal based on pressing force detected by a pressure sensor. The input device disclosed in PTL 1 switches information to be displayed when the detected pressing force exceeds a threshold.

CITATION LIST

Patent Literature

[PTL 1] Japanese Unexamined Patent Application Publication No. 2011-197750

SUMMARY OF INVENTION

Technical Problem

However, the conventional input device described above can only be controlled based on two values: whether or not the pressing force exceeds the threshold. Therefore, the use of the conventional input device is limited and its versatility is low.

In view of the above, the present disclosure provides a highly versatile detection method, detection device, and detection system.

Solution to Problem

A detection method according to one aspect of the present disclosure includes: obtaining periodically and repeatedly sensor values output from a capacitive sensor, and storing, in memory, the sensor values obtained as sensor data, the sensor data being time-series data; determining whether the sensor values obtained exceed a first threshold; calculating, as a first difference value of each of target sensor values, a difference between the target sensor value and a sensor value immediately before the target sensor value, the target sensor values including a sensor value determined to exceed the first threshold and past sensor values in reverse chronological order from the sensor value determined to exceed the first threshold; calculating, as a second difference value of each of the target sensor values, a difference between (i) the first difference value of the target sensor value and (ii) the first difference value of the sensor value immediately before the target sensor value; comparing each of the second difference values calculated and a second threshold, and selecting one sensor value from the sensor data based on a result of the comparing; and outputting the one sensor value selected.

A detection device according to one aspect of the present disclosure includes: an obtainer that obtains periodically and repeatedly sensor values output from a capacitive sensor, and stores, in memory, the sensor values obtained as sensor data, the sensor data being time-series data; a determiner that determines whether the sensor values obtained exceed a first threshold; a first calculator that calculates, as a first difference value of each of target sensor values, a difference between the target sensor value and a sensor value immediately before the target sensor value, the target sensor values including a sensor value determined to exceed the first threshold and past sensor values in reverse chronological order from the sensor value determined to exceed the first threshold; a second calculator that calculates, as a second difference value of each of the target sensor values, a difference between (i) the first difference value of the target sensor value and (ii) the first difference value of the sensor value immediately before the target sensor value; a comparator that compares each of the second difference values calculated and a second threshold, and selects one sensor value from the sensor data based on a result of the comparison; and an outputter that outputs the sensor value selected.

The detection system according to one aspect of the present disclosure includes the detection device according to the one aspect and the capacitive sensor described above.

Advantageous Effects of Invention

The present disclosure can provide, for example, a highly versatile detection method.

DESCRIPTION OF EMBODIMENTS

Overview of Present Disclosure

The following specifically describes an embodiment with reference to the drawings.

Note that each of the embodiments described below is merely a general or specific example. The numerical values, shapes, materials, structural elements, arrangement and connection of the structural elements, steps, order of the steps, etc., described in the following embodiment are given merely by way of illustration and are not intended to limit the present disclosure. Furthermore, among structural elements in the following embodiment, structural elements not recited in any one of the independent claims are described as optional structural elements.

Note that the figures are schematic illustrations and are not necessarily precise depictions. Therefore, for example, the figures are not necessarily to scale. Moreover, in the figures, structural elements that are essentially the same share like reference signs. Accordingly, duplicate description is omitted or simplified.

EMBODIMENT

1. Overview

Figure 1:
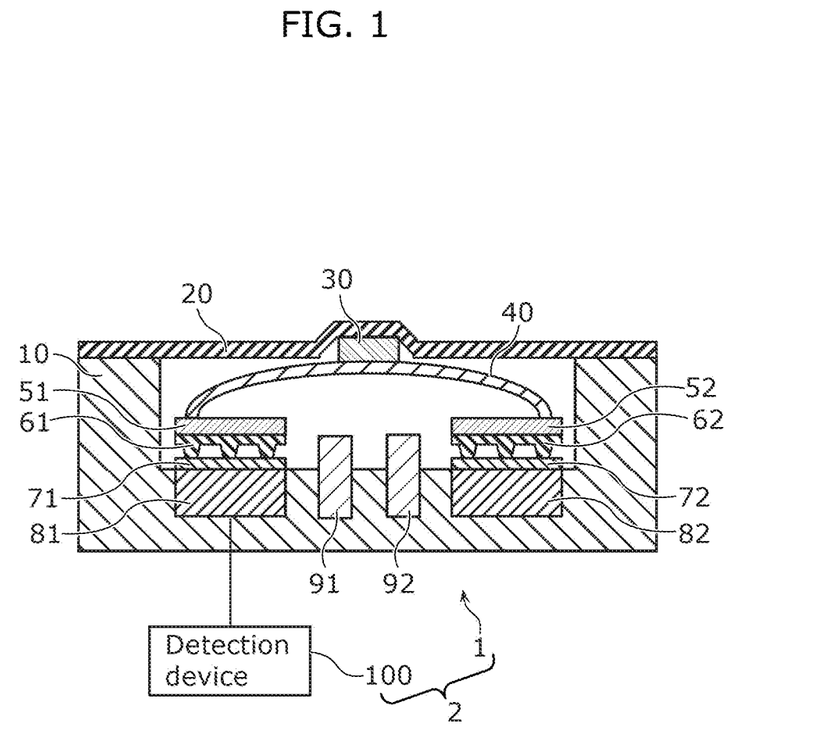
FIG. 1 is a diagram illustrating a configuration of a detection system and a schematic cross-sectional view of a capacitive switch according to an embodiment.

First, an overview of a detection method, a detection device, and a detection system according to the present embodiment will be described. FIG. 1 is a diagram illustrating a configuration of detection system 2 and a schematic cross-sectional view of capacitive switch 1 according to the present embodiment.

Detection system 2 illustrated in FIG. 1 is a system that detects operation input to capacitive switch 1 by a user. Detection system 2 includes capacitive switch 1 and detection device 100.

Capacitive switch 1 is an example of a capacitive sensor, and includes a capacitor whose capacitance value changes according to user operation. The sensor value output from capacitive switch 1 corresponds to the capacitance value of capacitive switch 1. Capacitive switch 1 is an input device that receives operation input from a user, and has functions of both a tactile switch and a touch sensor, for example. A specific configuration of capacitive switch 1 will be described later.

Detection device 100 detects operation input to capacitive switch 1 by a user, based on the sensor value output from capacitive switch 1. For example, the user can perform pressing operation and click operation on capacitive switch 1. Detection device 100 calculates the amount of pressing applied by the pressing operation and determines whether click operation is performed, based on the sensor value.

Detection device 100 is, for example, a microcontroller. The microcontroller includes, for example, non-volatile memory in which a program is stored; volatile memory, which is a temporary storage area for executing the program; an input/output port; and a processor that executes the program. At least one or more of the functions performed by detection device 100 may be implemented as software or hardware.

Detection system 2 is used for operating a camera by a user, as an example. For example, the amount of pressing applied to capacitive switch 1 is associated with the focus adjustment function of the camera. Moreover, the click operation performed on capacitive switch 1 is associated with the shutter function of the camera (i.e., image capturing operation). This allows the user to perform operation of capturing an image while focusing on a subject by adjusting the amount of pressing.

Note that the example of application of detection system 2 is not limited to cameras. For example, detection system 2 can be applied to a wide range of applications, such as controllers for game consoles, touch panel displays, various display devices, and various operation terminals.

2. Capacitive Switch

Next, a specific configuration of capacitive switch 1 will be described.

As illustrated in FIG. 1, capacitive switch 1 includes mount 10, cover film 20, push plate 30, movable contact 40, movable electrodes 51 and 52, conductive rubbers 61 and 62, insulating sheets 71 and 72, fixed electrodes 81 and 82, and conductive contacts 91 and 92.

Mount 10 is a main housing of capacitive switch 1, and is formed in a tray shape recessed in the middle portion. Cover film 20 is fixed to mount 10 to cover the recess in the middle portion. Below the lower surface of the middle portion of cover film 20, push plate 30 is disposed.

Note that, in the present description, "lower", "below", "upper", and "above" are directions determined by the positional relationships between cover film 20 and mount 10, and "below (downward or lower)" is a direction in which mount 10 is positioned relative to cover film 20, and "above (upward or upper)" is in the opposite direction. In other words, "below (downward or lower)" may not be vertically downward depending on the orientation of capacitive switch 1 during actual use.

The lower surface of push plate 30 is in contact with movable contact 40. Push plate 30 can press movable contact 40 downward according to the pressing force from a user. Movable contact 40 is also called a metal dome, and has a shape protruding upward. Each of movable electrodes 51 and 52 is connected to a different one of two ends of movable contact 40.

Movable electrode 51 is opposite to fixed electrode 81 with conductive rubber 61 and insulating sheet 71 interposed between movable electrode 51 and fixed electrode 81. Movable electrode 51 and fixed electrode 81 form first capacitor Ca (see FIG. 4). Movable electrode 52 is opposite to fixed electrode 82 with conductive rubber 62 and insulating sheet 72 interposed between movable electrode 52 and fixed electrode 82. Movable electrode 52 and fixed electrode 82 form second capacitor Cb (see FIG. 4).

Fixed electrodes 81 and 82 and conductive contacts 91 and 92 are fixed to mount 10. Fixed electrode 81 is connected to detection device 100, as illustrated in FIG. 1. Note that detection device 100 may be disposed inside mount 10 or disposed on an outside surface of mount 10. Both fixed electrode 82 and conductive contact 92 are connected to a ground (i.e., grounded). Conductive contact 91 is open.

Note that the configuration of capacitive switch 1 is not limited to the example illustrated in FIG. 1. For example, capacitive switch 1 does not need to include cover film 20 or conductive contact 91.

A user can operate capacitive switch 1 by touching the upper surface of cover film 20 and pressing push plate 30. In the following, transition of the mechanical state of capacitive switch 1 when operated by a user will be described with reference to FIG. 2 and FIG. 3.

Figure 2:
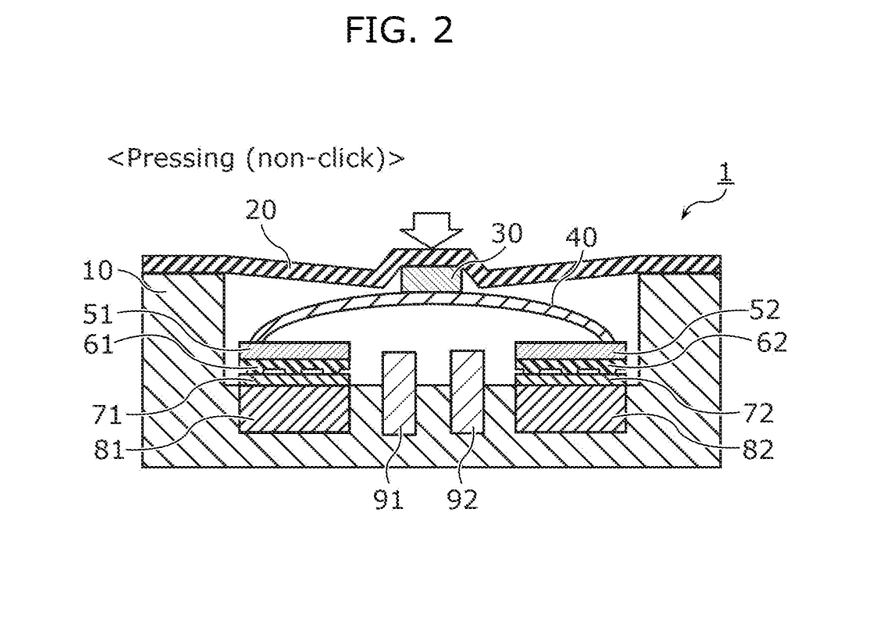
FIG. 2 is a schematic cross-sectional view of the capacitive switch when being pressed.
Figure 3:
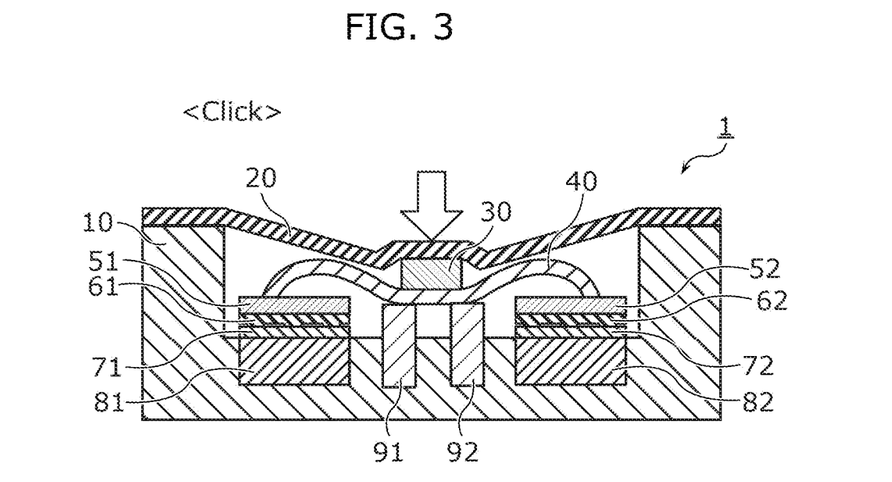
FIG. 3 is a schematic cross-sectional view of the capacitive switch when being clicked.

FIG. 2 is a schematic cross-sectional view of capacitive switch 1 when being pressed. FIG. 3 is a schematic cross-sectional view of capacitive switch 1 when being clicked. Note that FIG. 1 illustrates capacitive switch 1 that is not pressed by a user, that is, in the state of no load.

As illustrated in FIG. 2, cover film 20 is deformed and push plate 30 is moved downward due to the pressing force applied from above. The downward movement of push plate 30 also moves movable contact 40 and movable electrodes 51 and 52 downward. Since conductive rubbers 61 and 62 are flexible, the force of movable electrodes 51 and 52 moving downward causes conductive rubbers 61 and 62 to deform. This changes the distance between movable electrode 51 and fixed electrode 81, and the distance between movable electrode 52 and fixed electrode 82. A plurality of protrusions are provided on the lower surface of each of conductive rubbers 61 and 62. These protrusions greatly deform easily and thus the change in distance can be increased.

In addition, when cover film 20 is pressed more strongly, movable contact 40 is inverted, as illustrated in FIG. 3. The inverted movable contact 40 contacts conductive contacts 91 and 92. Click operation is to press cover film 20 until movable contact 40 and conductive contacts 91 and 92 are in contact with one another.

Sensor values to be output by capacitive switch 1 greatly differ between the pressing operation and the click operation. The following describes the sensor values that are output and an equivalent circuit for capacitive switch 1.

Figure 4:
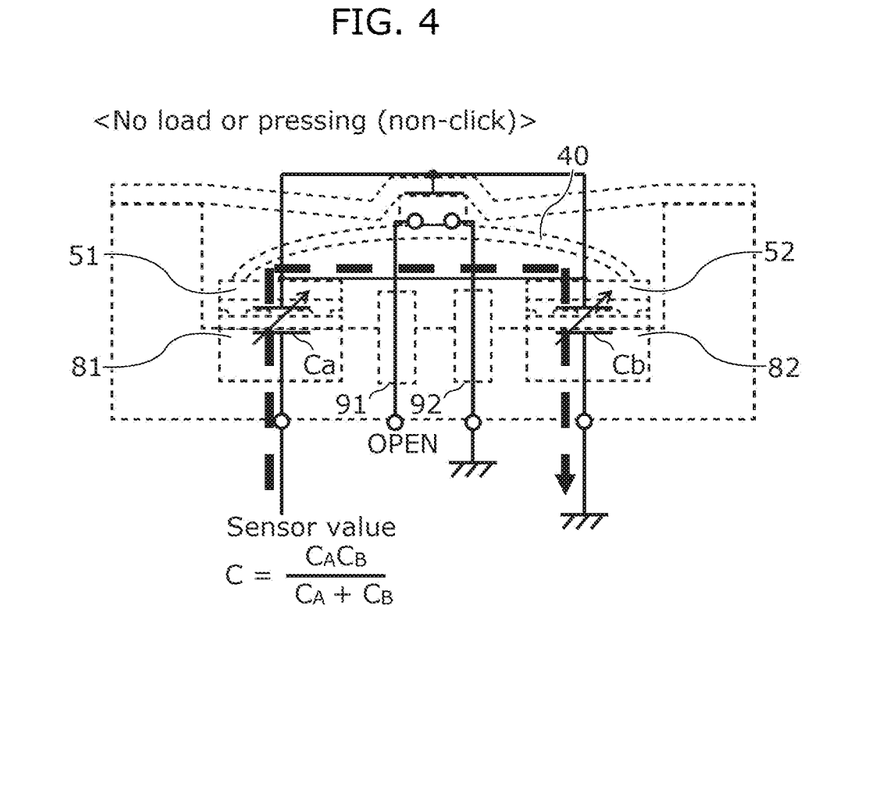
FIG. 4 is an equivalent circuit diagram of the capacitive switch when no load is applied or when being pressed.

FIG. 4 is an equivalent circuit diagram of capacitive switch 1 when being pressed. As illustrated in FIG. 4, capacitive switch 1 includes first capacitor Ca, which includes movable electrode 51 and fixed electrode 81, and second capacitor Cb, which includes movable electrode 52 and fixed electrode 82. Both first capacitor Ca and second capacitor Cb are variable capacitors whose capacitance values change due to change in distance between the electrodes. Movable electrodes 51 and 52 are electrically connected via movable contact 40. Therefore, a series connection of first capacitor Ca and second capacitor Cb is formed between fixed electrode 81 and fixed electrode 82.

Sensor value C to be output to detection device 100 corresponds to the capacitance value between fixed electrode 81 and the ground, that is, the capacitance value of series connection of first capacitor Ca and second capacitor Cb. Therefore, sensor value C is expressed by $C_A \times C_B/(C_A+C_B)$. Note that capacitance value $C_A$ is a capacitance value of first capacitor Ca. Capacitance value $C_B$ is a capacitance value of second capacitor Cb.

Figure 5:
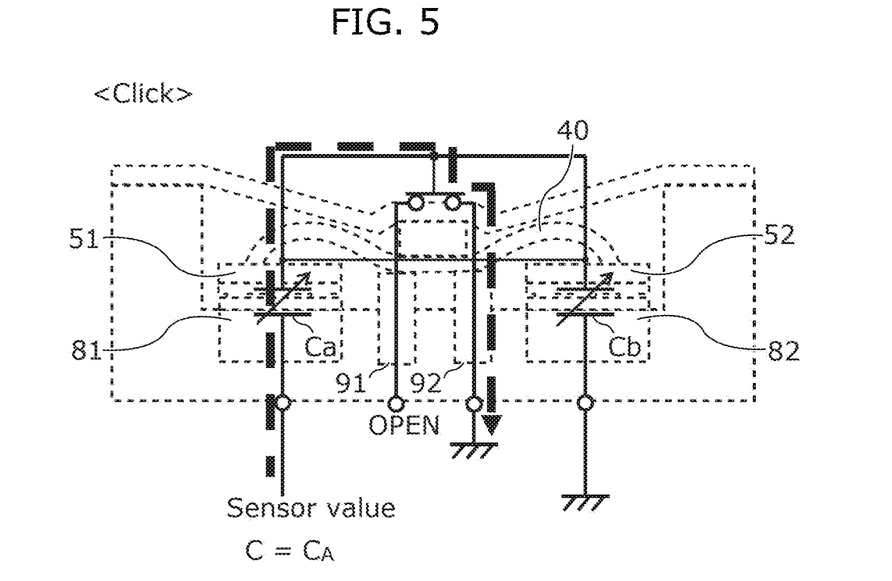
FIG. 5 is an equivalent circuit diagram of the capacitive switch when being clicked.

FIG. 5 is an equivalent circuit diagram of capacitive switch 1 when being clicked. When being clicked, movable contact 40 contacts conductive contact 92, and thus movable contact 40 is connected to the ground. Therefore, since both ends of second capacitor Cb are connected to the ground, the capacitance value between fixed electrode 81 and the ground is only capacitance value $C_A$ of first capacitor Ca. Therefore, sensor value C changes greatly from $C_A \times C_B/(C_A+C_B)$ to $C_A$ before and after click.

Figure 6:
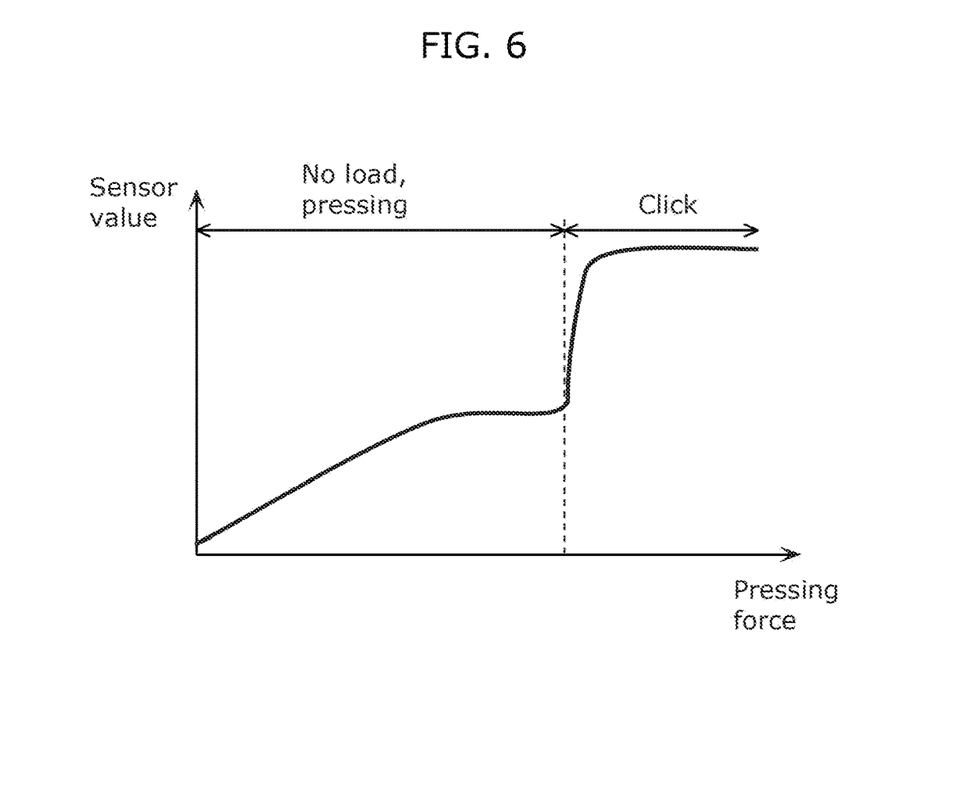
FIG. 6 is a graph showing a relationship between pressing force by a user and a sensor value output by the capacitive switch.

FIG. 6 is a graph showing a relationship between the pressing force by a user and a sensor value output by capacitive switch 1. As illustrated in FIG. 6, the sensor value (=capacitance value) increases in both first capacitor Ca and second capacitor Cb as the pressing force increases, because the distance between the electrodes decreases due to deformation of conductive rubbers 61 and 62. By increasing the pressing force, the sensor value is maintained substantially constant after conductive rubbers 61 and 62 are fully deformed. By increasing the pressing force, movable contact 40 is inverted and contacts conductive contact 92, and thus the capacitance value changes greatly from $C_A \times C_B/(C_A+C_B)$ to $C_A$. Therefore, by setting a threshold between $C_A \times C_B/(C_A+C_B)$ and $C_A$, the click operation can be easily detected.

Note that conductive contact 91 is electrically connected to conductive contact 92 when being clicked and is connected to the ground. Therefore, the presence or absence of click may be determined by detecting the potential of conductive contact 91.

[Detection Device]

Figure 7:
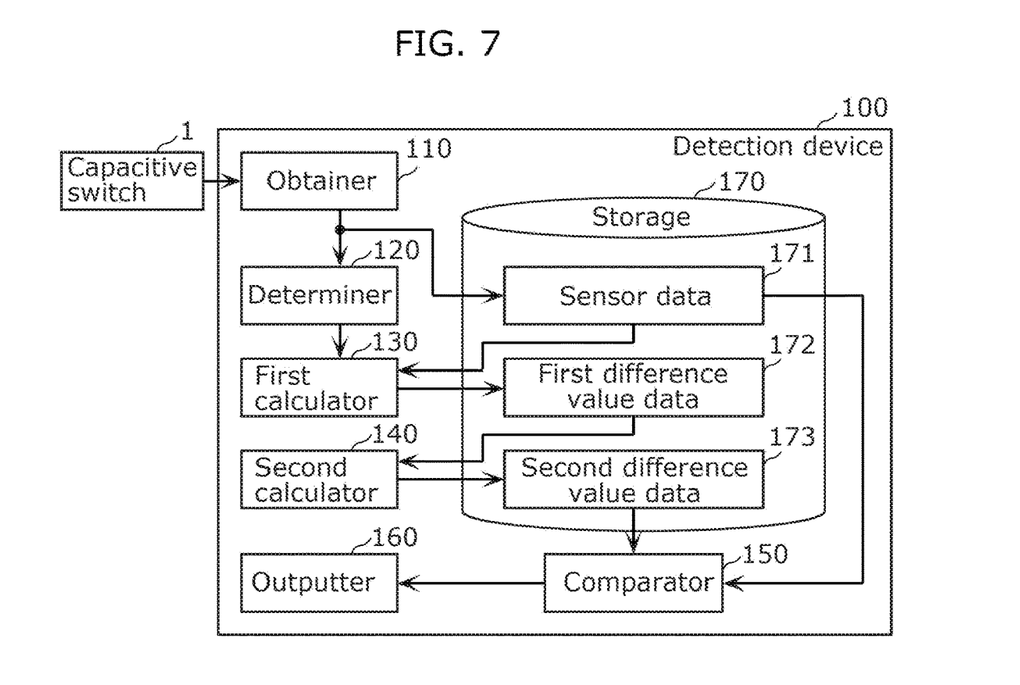
FIG. 7 is a block diagram illustrating a functional configuration of the detection device according to the embodiment.

Next, a configuration of detection device 100 will be described with reference to FIG. 7. FIG. 7 is a block diagram illustrating a functional configuration of detection device 100 according to the present embodiment.

As illustrated in FIG. 7, detection device 100 includes obtainer 110, determiner 120, first calculator 130, second calculator 140, comparator 150, outputter 160, and storage 170.

Obtainer 110 periodically and repeatedly obtains sensor values $C_X$ output from capacitive switch 1. Obtainer 110 stores, in storage 170, the obtained sensor values $C_X$ as sensor data 171, which is time-series data. Note that X is a subscript indicating the order in which sensor value C is obtained. In the present embodiment, sensor value $C_1$ represents a latest sensor value. A greater value of X represents an older sensor value.

Determiner 120 determines whether sensor value $C_X$ obtained by obtainer 110 exceeds threshold Th1. Threshold Th1 is an example of the first threshold, and is set, for example, between $C_A \times C_B/(C_A+C_B)$ and $C_A$.

First calculator 130 calculates, as first difference value $\Delta 1_X$ of each of target sensor values $C_X$, a difference between target sensor value $C_X$ and sensor value $C_{X+1}$ immediately before target sensor value $C_X$. Target sensor values $C_X$ include a sensor value determined to exceed threshold Th1 and past sensor values in reverse chronological order from sensor value $C_X$ determined to exceed threshold Th1. First calculator 130 stores, in storage 170, first difference value $\Delta 1_X$ of each of target sensor values $C_X$, as first difference value data 172. A specific process for calculating first difference value $\Delta 1_X$ will be described later.

Second calculator 140 calculates, as second difference value $\Delta 2_X$ of each of target sensor values $C_X$, a difference between (i) first difference value $\Delta 1_X$ of target sensor value $C_X$, and (ii) first difference value $\Delta 1_{X+1}$ of sensor value $C_{X+1}$ immediately before target sensor value $C_X$. Target sensor values $C_X$ include a sensor value determined to exceed threshold Th1 and past sensor values in reverse chronological order from the sensor value determined to exceed threshold Th1. Second calculator 140 stores, in storage 170, second difference value $\Delta 2_X$ of each of target sensor values $C_X$, as second difference value data 173. A specific process for calculating second difference value $\Delta 2_X$ will be described later.

Comparator 150 compares each of the calculated second difference values $\Delta 2_X$ and threshold Th2. Threshold Th2 is an example of a second threshold. Comparator 150 selects one sensor value $C_{Ret}$ from sensor data 171, based on the result of the comparison. Sensor value $C_{Ret}$ selected by comparator 150 represents the amount of pressing immediately before the click operation is performed. A specific selection process will be described later.

Outputter 160 outputs sensor value $C_{Ret}$ selected by comparator 150. In addition, outputter 160 further outputs a result of determination by determiner 120. Specifically, outputter 160 outputs, as a result of determination, a signal indicating that a click operation has been performed, and outputs a sensor value corresponding to the amount of pressing immediately before the click operation has been performed.

Storage 170 is memory for storing sensor data 171. Moreover, storage 170 stores first difference value data 172 and second difference value data 173. Storage 170 has a memory capacity that can store M sensor values $C_X$, M−1 first difference values $\Delta 1_X$, and M−2 second difference values $\Delta 2_X$, where M is a natural number greater than or equal to 3. In addition, for example, a program to be executed by each processing unit of detection device 100 is stored in storage 170.

Note that storage 170 does not need to be included in detection device 100. Detection device 100 may use, as storage 170, storage that can be included in a device that can communicate with detection device 100.

[Operation]

Next, the operation of detection device 100 according to the present embodiment, that is, a detection method according to the present embodiment, will be described with reference to specific data.

Figure 8:
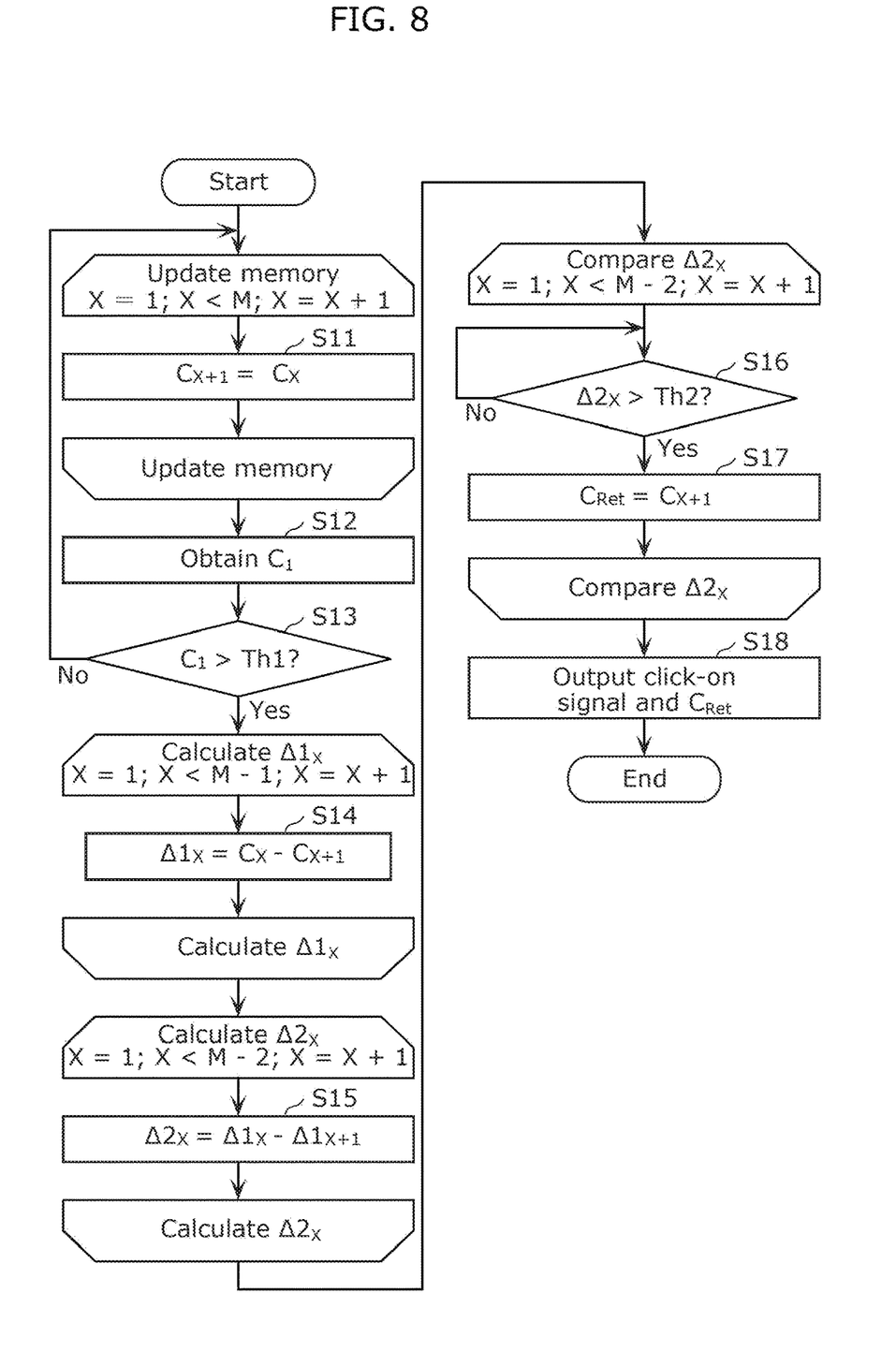
FIG. 8 is a flowchart illustrating a detection method according to the embodiment.

FIG. 8 is a flowchart illustrating a detection method according to the present embodiment. The detection method illustrated in FIG. 8 is executed by detection device 100.

As illustrated in FIG. 8, firstly, detection device 100 updates storage 170 (S11). Specifically, detection device 100 secures a memory area to store a latest sensor value C output from capacitive switch 1, as sensor value $C_1$. More specifically, detection device 100 updates sensor values $C_1$ to $C_{M-1}$ among sensor values $C_1$ to $C_M$ stored in M memory areas, to sensor values $C_2$ to $C_M$. Note that the oldest sensor value $C_M$ before updating is deleted.

Next, obtainer 110 obtains sensor value C output from capacitive switch 1, and stores the output sensor value C as sensor value $C_1$ in storage 170 (S12).

Next, determiner 120 determines whether the obtained sensor value $C_1$ exceeds threshold Th1 (S13). If sensor value $C_1$ does not exceed threshold Th1 (No in S13), detection device 100 updates the memory again (S11). Until sensor value $C_1$ exceeds threshold Th1, the sensor value is stored in storage 170 as sensor data 171.

Figure 9:
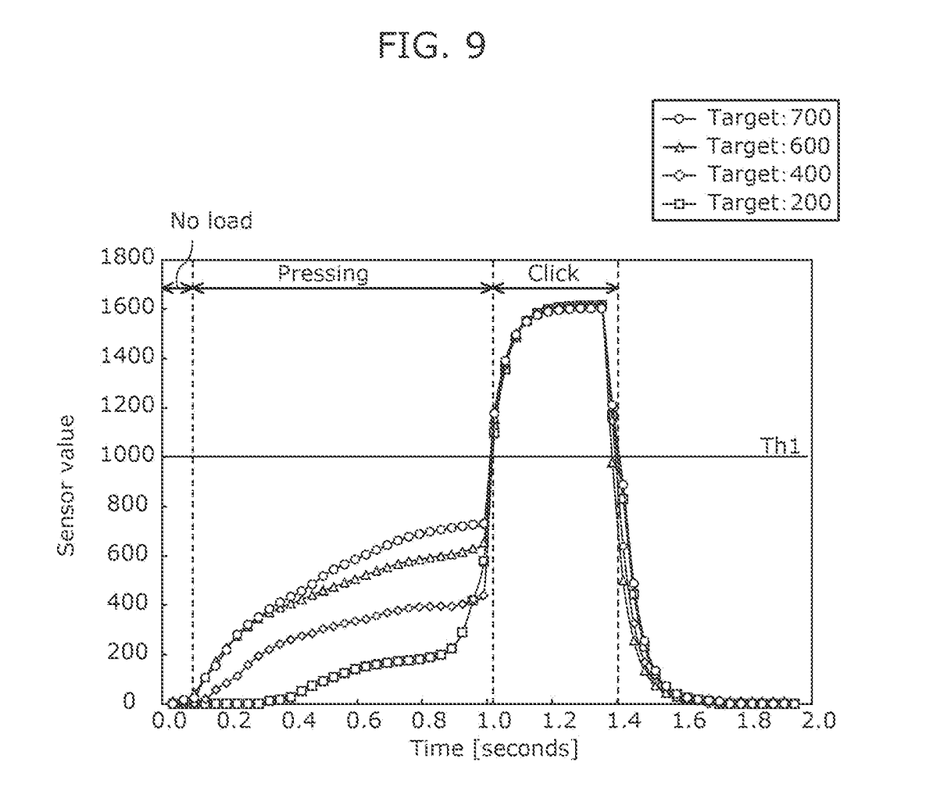
FIG. 9 is a graph illustrating an example of changes in the sensor value over time when the capacitive switch is used.

FIG. 9 is a graph illustrating an example of sensor data 171 stored in storage 170. FIG. 9 shows four lines, each of which corresponds to one item of sensor data 171. Note that each of the four lines shows change in the sensor value over time when a user presses capacitive switch 1 to four different target values and then performs click operation. The plotted points in each line represent the sensor values output from capacitive switch 1, that is, the sensor values obtained by obtainer 110. Here, the sensor values are repeatedly output on a cycle of 33 ms.

In FIG. 9, threshold Th1=1000 is set, and the sensor value in the vicinity of approximately 1.0 second is the latest sensor value $C_1$ exceeding threshold Th1. As illustrated in FIG. 8, when sensor value $C_1$ is determined to exceed threshold Th1 (Yes in S13), first calculator 130 calculates first difference value $\Delta 1_X$ of each of target sensor values $C_X$ that are sensor values stored in storage 170 (S14).

Figure 10:
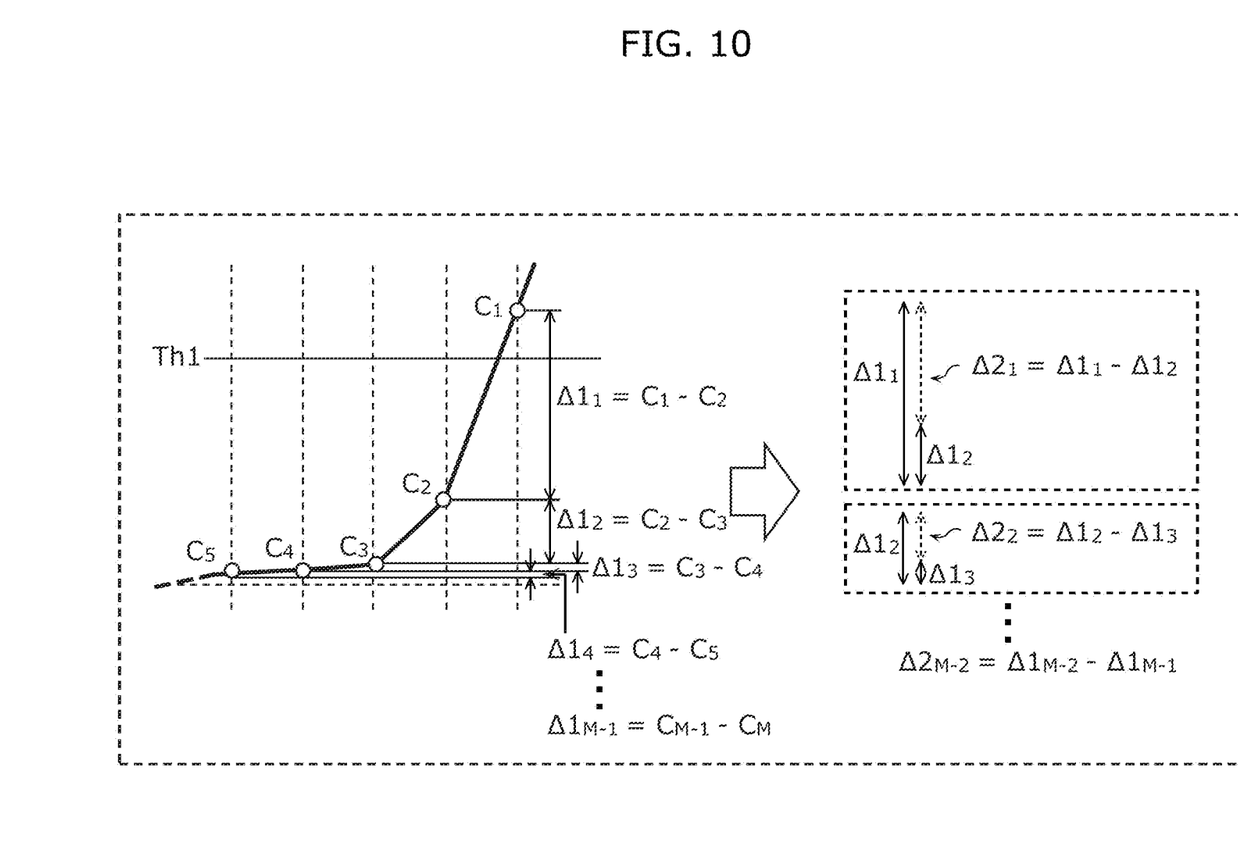
FIG. 10 is a diagram for illustrating a process of calculating a first difference value and a second difference value.

FIG. 10 is a diagram for illustrating a process for calculating first difference value $\Delta 1_X$ and second difference value $\Delta 2_X$. Specifically, as illustrated in FIG. 10, first calculator 130 calculates first difference value $\Delta 1_X$ of each of target sensor values $C_X$ that are M−1 sensor values $C_1$ to $C_{M-1}$ by the following expression (1).

$$\Delta 1_x = C_x - C_{x+1} \ (X = 1 \text{ to } M - 1) \qquad (1)$$

The calculated first difference values $\Delta 1_X$ are stored in storage 170 as first difference value data 172.

Next, as illustrated in FIG. 8, second calculator 140 calculates second difference value $\Delta 2_X$ of each of target sensor values $C_X$ that are sensor values stored in storage 170 (S15). Specifically, second calculator 140 calculates second difference value $\Delta 2_X$ of each of target sensor values $C_X$ that are M−2 sensor values $C_1$ to $C_{M-2}$ by the following expression (2).

$$\Delta 2_x = \Delta 1_x - \Delta 1_{x+1} = (X = 1 \text{ to } M - 2) \qquad (2)$$

The calculated second difference values $\Delta 2_X$ are stored in storage 170 as second difference value data 173.

Next, as illustrated in FIG. 8, comparator 150 compares each of second difference values $\Delta 2_X$ and threshold Th2 (S16). Specifically, comparator 150 determines whether each of second difference values $\Delta 2_X$ exceeds threshold Th2. Then, comparator 150 selects sensor value $C_{Ret}$ to be output, based on the result of comparison (S17). Specifically, comparator 150 selects, as sensor value $C_{Ret}$, sensor value $C_{X+1}$ immediately before target sensor value $C_X$ corresponding to second difference value $\Delta 2_X$ that exceeds threshold Th2. By repeating the above in order from X=1 to X=M−2, if there are a plurality of second difference values $\Delta 2_X$ exceeding threshold Th2, a sensor value immediately before the oldest sensor value is selected as sensor value $C_{Ret}$ from among the target sensor values corresponding to second difference values $\Delta 2_X$ exceeding threshold Th2.

Figure 11:
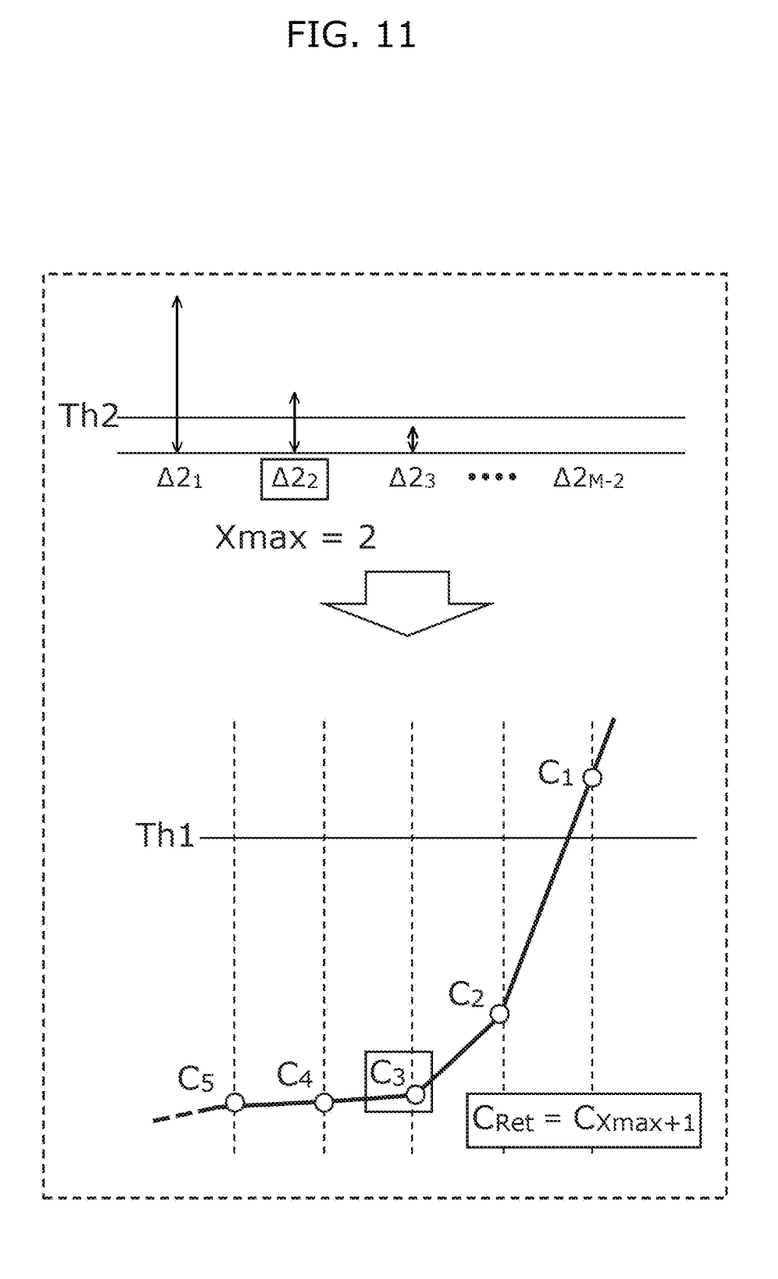
FIG. 11 is a diagram for illustrating a process of selecting a sensor value to be output.
Figure 12:
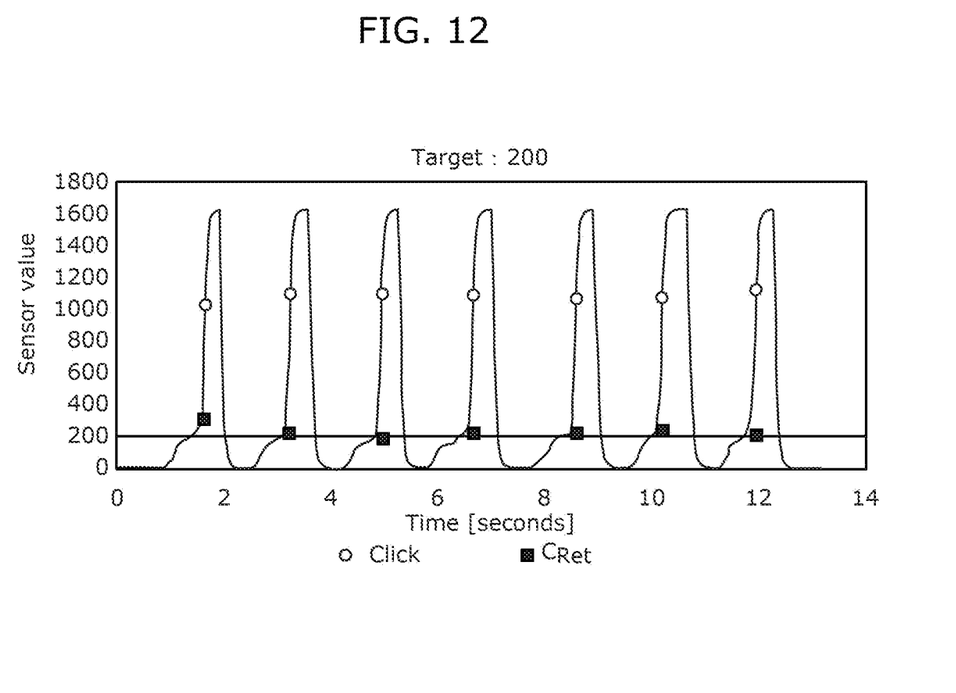
FIG. 12 is a graph illustrating time-series data of sensor values and output sensor values when click is repeatedly performed starting from a pressing force of a first target value.
Figure 13:
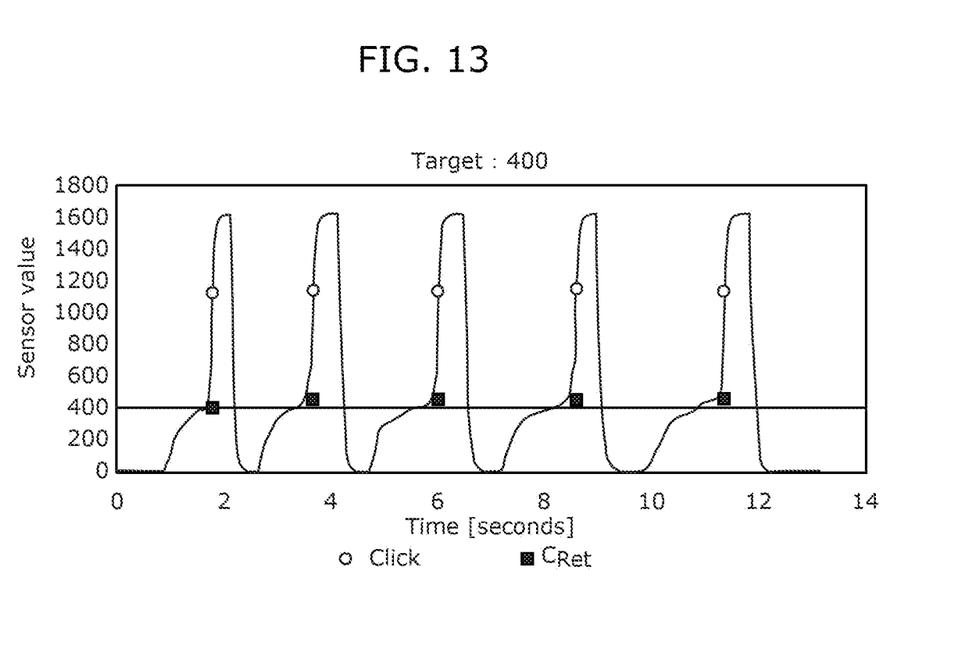
FIG. 13 is a graph illustrating time-series data of sensor values and output sensor values when click is repeatedly performed from a pressing force of a second target value.
Figure 14:
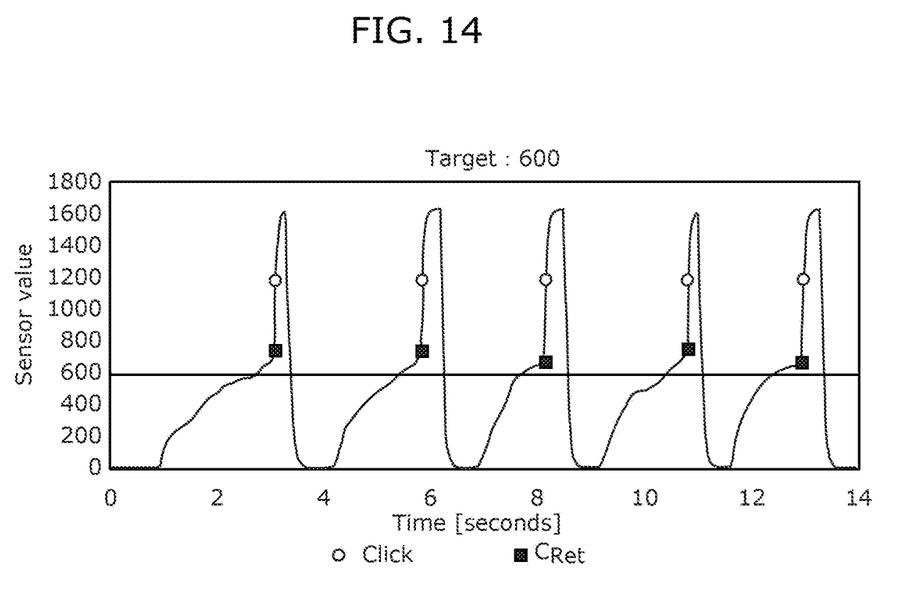
FIG. 14 is a graph illustrating time-series data of sensor values and output sensor values when click is repeatedly performed from a pressing force of a third target value.
Figure 15:
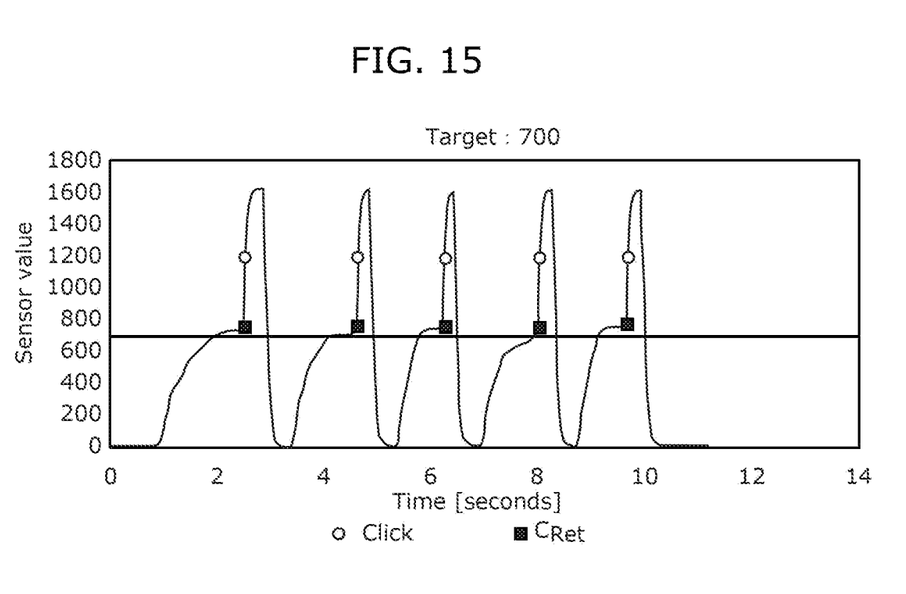
FIG. 15 is a graph illustrating time-series data of sensor values and output sensor values when click is repeatedly performed from a pressing force of a fourth target value.

FIG. 11 is a diagram for illustrating a process for selecting sensor value $C_{Ret}$ to be output. In FIG. 11, two second difference values $\Delta 2_1$ and $\Delta 2_2$ exceed threshold Th2. Comparator 150 determines the subscript Xmax of second difference value $\Delta 2_2$ corresponding to the oldest sensor value, among the two second difference values $\Delta 2_1$ and $\Delta 2_2$ that exceed threshold Th2. Here, Xmax=2, and thus comparator 150 selects sensor value $C_{Xmax+1}$ immediately before sensor value $C_{Xmax}$, i.e., sensor value $C_3$, as sensor value $C_{Ret}$ to be output.

Next, as illustrated in FIG. 8, outputter 160 outputs the result of determination indicating that the click operation has been performed (click-on signal) and sensor value $C_{Ret}$ that has been selected (S18).

Advantageous Effects, Etc.

FIGS. 12 to 15 illustrate the verification results of accuracy of detection by the detection method according to the present embodiment by actually performing a click operation every two seconds by a user. Each of FIGS. 12 to 15 is a graph illustrating time-series data of the sensor values and the output sensor values when click is repeatedly performed from a pressing force of four different target values. Each graph represents output sensor value $C_{Ret}$ with a square marker. As shown with the square markers representing $C_{Ret}$ in each graph, it can be seen that each click can be detected at an approximately targeted amount of pressing, regardless of the strength of the amount of pressing immediately before the click.

Figure 16:
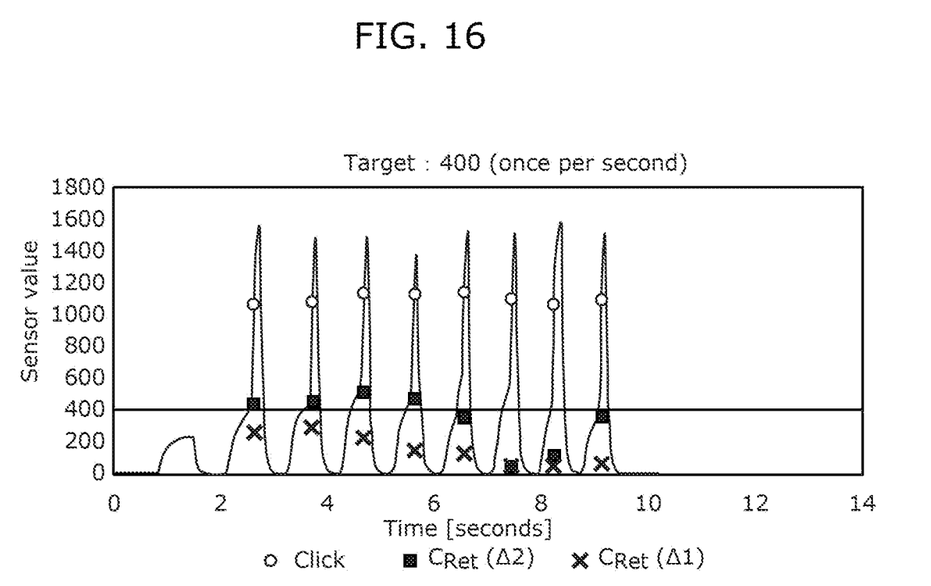
FIG. 16 is a graph illustrating time-series data of sensor values and output sensor values when click is repeatedly performed from a pressure force of the second target value at twice the speed in the case illustrated in FIG. 13.

Moreover, FIG. 16 illustrates a case where the user performs the click operation at twice the speed (once per second). FIG. 16 is a graph illustrating time-series data of the sensor values and the output sensor values when click is repeatedly performed at twice the speed in the case illustrated in FIG. 13.

As a comparative example, FIG. 16 also illustrates the case where sensor values $C_{Ret}(\Delta 1)$ are selected based on the results of comparison between first difference values $\Delta 1_X$ and the threshold, without calculating second difference values $\Delta 2_X$. The method of selecting sensor values $C_{Ret}(\Delta 1)$ is the same as the method of selecting sensor values $C_{Ret}(\Delta 2)$, except that first difference values $\Delta 1_X$ are used instead of second difference values $\Delta 2_X$. Note that the threshold used for comparison is a value suitable for the comparison with first difference values $\Delta 1_X$.

As illustrated in FIG. 16, when the results of comparison of first difference value $\Delta 1_X$ are used, sensor values $C_{Ret}(\Delta 1)$ deviate significantly from the target value (=400) that should have been selected. In other words, when the results of comparison of first difference values $\Delta 1_X$ are used, the detection accuracy of the sensor value immediately before the click operation is low.

In contrast, when the results of comparison of second difference values $\Delta 2_X$ are used, the number of times when values close to the target value are detected is greater than that when the results of comparison of first difference values $\Delta 1_X$ are used. In other words, with the detection method according to the present embodiment, it can be seen that the detection accuracy of the sensor value immediately before the click operation is high.

As described above, the detection method according to one aspect of the present disclosure includes: obtaining periodically and repeatedly sensor values output from capacitive sensor 1, and storing, in storage 170, the sensor values obtained as sensor data 171, sensor data 171 being time-series data; determining whether the sensor values obtained exceed threshold Th1; calculating, as first difference value $\Delta 1_X$ of each of target sensor values $C_X$, a difference between target sensor value $C_X$ and sensor value $C_{X+1}$ immediately before target sensor value $C_X$, target sensor values $C_X$ including a sensor value determined to exceed threshold Th1 and past sensor values in reverse chronological order from the sensor value determined to exceed threshold Th1; calculating, as a second difference value $\Delta 2_X$ of each of target sensor values $C_X$, a difference between (i) first difference value $\Delta 1_X$ of target sensor value $C_X$ and (ii) first difference value $\Delta 1_{X+1}$ of sensor value $C_{X+1}$ immediately before target sensor value $C_X$; comparing each of second difference values $\Delta 2_X$ calculated and threshold Th2, and selecting one sensor value $C_{Ret}$ from the sensor data based on a result of the comparing; and outputting the one sensor value $C_{Ret}$ selected.

With this, the sensor value immediately before the click operation can be output highly accurately. Since not only the presence or absence of a click operation, but also a sensor value immediately before the click operation is output, this detection method can be applied to various devices and increase versatility. In addition, the accuracy of the sensor value to be output is sufficiently high, and thus this detection method can be applied to detect delicate operation input.

Moreover, for example, in the comparing, sensor value $C_{X+1}$ immediately before target sensor value $C_X$ corresponding to second difference value $\Delta 2_X$ that exceeds threshold Th2 is selected based on the result of the comparing.

This can increase the accuracy of the sensor value to be output.

Moreover, for example, in the comparing, when there are a plurality of second difference values $\Delta 2_X$ that exceed threshold Th2 based on the result of the comparing, sensor value $C_{Xmax+1}$ immediately before an oldest sensor value $C_{Xmax}$ is selected from among target sensor values $C_X$ corresponding to the plurality of second difference values $\Delta 2_X$.

This can increase the accuracy of the sensor value to be output.

Moreover, for example, the outputting includes further outputting a result of the determining.

With this, a result of determination corresponding to whether the click operation is performed can also be output.

Moreover, detection device 100 according to the present embodiment includes: obtainer 110 that obtains periodically and repeatedly sensor values output from capacitive sensor 1, and stores, in storage 170, the sensor values obtained as sensor data 171, sensor data 171 being time-series data; determiner 120 that determines whether the sensor values obtained exceed threshold Th1; first calculator 130 that calculates, as first difference value $\Delta 1_X$ of each of target sensor values $C_X$, a difference between target sensor value $C_X$ and sensor value $C_{X+1}$ immediately before target sensor value $C_X$, target sensor values $C_X$ including a sensor value determined to exceed threshold Th1 and past sensor values in reverse chronological order from the sensor value determined to exceed threshold Th1; second calculator 140 that calculates, as second difference value $\Delta 2_X$ of each of target sensor values $C_X$, a difference between (i) first difference value $\Delta 1_X$ of target sensor value $C_X$ and (ii) first difference value $\Delta 1_{X+1}$ of sensor value $C_{X+1}$ immediately before target sensor value $C_X$; comparator 150 that compares each of second difference values $\Delta 2_X$ calculated and threshold Th2, and selects one sensor value $C_{Ret}$ from sensor data 171 based on a result of the comparison; and outputter 160 that outputs sensor value $C_{Ret}$ selected.

With this, as with the detection method described above, the sensor value immediately before the click operation can be output with high accuracy. The present detection method outputs not only the presence or absence of a click operation, but also a sensor value immediately before the click operation. Therefore, this detection method can be applied to various devices and increase versatility. In addition, the accuracy of the output sensor value is sufficiently high, and thus this detection method can be applied to detect delicate operation input.

Moreover, detection system 2 according to the present embodiment includes detection device 100 and capacitive switch 1.

With this, the same advantageous effects can be obtained as with detection device 100 described above.

OTHER EMBODIMENTS

The detection method, detection device, and detection system according to one or more aspects have been described above based on the embodiment, but the present disclosure should not be limited to the embodiment described above. Various modifications of the present embodiment as well as embodiments resulting from combinations of structural elements of the different embodiments that may be conceived by those skilled in the art may be included within the scope of the one or more aspects as long as these do not depart from the teachings of the present disclosure.

For example, in the example illustrated in FIG. 8, first difference values $\Delta 1_X$ and second difference values $\Delta 2_X$ are calculated when sensor value $C_1$ exceeds threshold Th1, but the present disclosure is not limited to this example. For example, first difference values $\Delta 1_X$ and second difference values $\Delta 2_X$ may be calculated each time a sensor value is obtained.

Moreover, sensor value $C_{Ret}$ selected by comparator 150 does not need to be sensor value $C_{Xmax+1}$. In other words, comparator 150 may select a sensor value that is at least two values before the oldest sensor value from among the target sensor values corresponding to second difference values exceeding threshold Th2, instead of the sensor value immediately before the oldest sensor value from among the target sensor values corresponding to second difference values exceeding threshold Th2. For example, comparator 150 may output, for instance, sensor value $C_{Xmax+2}$ or sensor value $C_{Xmax+3}$, as sensor value $C_{Ret}$. For example, if a user performs pressing at a sensor value slowly enough and then performs click operation, (i) sensor value $C_{Xmax+1}$ and (ii) sensor value $C_{Xmax+2}$ or $C_{Xmax+3}$ may be almost the same value. Therefore, even when sensor value $C_{Xmax+2}$ or $C_{Xmax+3}$ is selected and output instead of sensor value $C_{Xmax+1}$, sensor value $C_{Xmax+2}$ or $C_{Xmax+3}$ can be treated as the sensor value immediately before the click operation with substantially equivalent accuracy.

Moreover, for example, outputter 160 does not need to output the result of determination indicating that the click operation has been performed. For example, a device that is to receive sensor value $C_{Ret}$ may determine that the click operation has been performed, as a result of the device obtaining the output sensor value $C_{Ret}$.

Moreover, in the above embodiment, a process performed by a specific processing unit may be performed by another processing unit. Moreover, the sequence of processes may be changed, or processes may be performed in parallel. Moreover, distribution of the structural elements included in detection system 2 to a plurality of devices is an example. For example, structural elements included one device may be included in another device. Moreover, detection system 2 may also be achieved as a single device.

For example, the processes described in the embodiment may be achieved by centralized processing by a single device (system), or by distributed processing by multiple devices. Moreover, the processor that executes the above program may be a single processor or multiple processors. In other words, centralized processing may be performed, or distributed processing may be performed.

In addition, in the above embodiment, all or at least one of the structural components, such as a controller, may include dedicated hardware, or may be achieved by executing an appropriate software program for each structural element. Each structural element may be achieved by a program executor, such as a central processing unit (CPU) or a processor, reading and executing a software program recorded on a recording medium, such as a hard disk drive (HDD) or semiconductor memory.

In addition, the structural elements such as a controller may include one or more electronic circuits. Each of the one or more electronic circuits may be a general-purpose circuit or a dedicated circuit.

One or more electronic circuits may include, for example, a semiconductor device, an integrated circuit (IC), or large scale integration (LSI). An IC or LSI may be integrated on a single chip or on multiple chips. Due to a difference in the degree of integration, the electronic circuit referred here to as an IC or LSI may be referred to as a system LSI, very large scale integration (VLSI), or ultra large scale integration (ULSI). Furthermore, a field programmable gate array (FPGA), which is programmable after manufacturing of the LSI, can be used for the same purposes.

In addition, the general or specific aspects of the present disclosure may be achieved by a system, a device, a method, an integrated circuit, or a computer program. Alternatively, these may be achieved using a non-transitory computer-readable recording medium such as an optical disk, HDD, or semiconductor memory on which the computer program is recorded. Furthermore, these may be achieved using any combination of systems, devices, methods, integrated circuits, computer programs, and recording media.

In addition, various changes, replacements, additions, omissions, etc. can be made on each of the above embodiments within the scope of the appended claims and their equivalents.

INDUSTRIAL APPLICABILITY

The present disclosure can be used as a highly versatile detection method, detection device, and detection system. For example, the present disclosure can be used for various input devices and user interface devices.

The invention claimed is:

1. A detection method comprising:
obtaining periodically and repeatedly sensor values output from a capacitive sensor, and storing, in memory, the sensor values obtained as sensor data, the sensor data being time-series data;
determining whether the sensor values obtained exceed a first threshold;
calculating, as a first difference value of each of target sensor values, a difference between the target sensor value and a sensor value immediately before the target sensor value, the target sensor values including a sensor value determined to exceed the first threshold and past sensor values in reverse chronological order from the sensor value determined to exceed the first threshold;
calculating, as a second difference value of each of the target sensor values, a difference between (i) the first difference value of the target sensor value and (ii) the first difference value of the sensor value immediately before the target sensor value;
comparing each of the second difference values calculated and a second threshold, and selecting one sensor value from the sensor data based on a result of the comparing; and
outputting the one sensor value selected.

2. The detection method according to claim 1, wherein in the comparing, a sensor value immediately before a target sensor value corresponding to a second difference value that exceeds the second threshold is selected based on the result of the comparing.

3. The detection method according to claim 1, wherein in the comparing, when there are a plurality of second difference values that exceed the second threshold based on the result of the comparing, a sensor value immediately before an oldest sensor value is selected from among target sensor values corresponding to the plurality of second difference values.

4. The detection method according to claim 1, wherein the outputting includes further outputting a result of the determining.

5. A detection device comprising:

an obtainer that obtains periodically and repeatedly sensor values output from a capacitive sensor, and stores, in memory, the sensor values obtained as sensor data, the sensor data being time-series data;

a determiner that determines whether the sensor values obtained exceed a first threshold;

a first calculator that calculates, as a first difference value of each of target sensor values, a difference between the target sensor value and a sensor value immediately before the target sensor value, the target sensor values including a sensor value determined to exceed the first threshold and past sensor values in reverse chronological order from the sensor value determined to exceed the first threshold;

a second calculator that calculates, as a second difference value of each of the target sensor values, a difference between (i) the first difference value of the target sensor value and (ii) the first difference value of the sensor value immediately before the target sensor value;

a comparator that compares each of the second difference values calculated and a second threshold, and selects one sensor value from the sensor data based on a result of the comparison; and an outputter that outputs the sensor value selected.

6. A detection system comprising:
the detection device according to claim 5; and
the capacitive sensor.

* * * * *